United States Patent
Akram et al.

(10) Patent No.: US 6,592,383 B2
(45) Date of Patent: Jul. 15, 2003

(54) EXTENDABLE AND RETRACTABLE TYPE 2 PC CARD AND METHOD OF OPERATION THEREOF

(76) Inventors: M. Tahir Akram, 302 College Avenue W., Unit #183, Guelph, Ontario (CA), N1G 4T6; Karel Jirsa, 18 Maple Street, Guelph, Ontario (CA), N1G 2G2

( * ) Notice: Subject to any disclaimer, the term of this patent is extended or adjusted under 35 U.S.C. 154(b) by 0 days.

(21) Appl. No.: 09/741,866

(22) Filed: Dec. 22, 2000

(65) Prior Publication Data

US 2002/0001979 A1 Jan. 3, 2002

Related U.S. Application Data

(60) Provisional application No. 60/171,632, filed on Dec. 27, 1999.

(51) Int. Cl.[7] .............................................. H01R 13/44
(52) U.S. Cl. ..................... 439/131; 630/131; 630/946.2
(58) Field of Search ............................... 435/946.2, 131; 361/736, 737

(56) References Cited

U.S. PATENT DOCUMENTS

| | | | | |
|---|---|---|---|---|
| 5,505,633 A | * | 4/1996 | Broadbent | 439/946 |
| 5,562,463 A | * | 10/1996 | Tan | 439/946 |
| 5,608,607 A | * | 3/1997 | Dittmer | 439/946 |
| 5,667,395 A | * | 9/1997 | Okada et al. | 439/946 |
| 5,692,914 A | * | 12/1997 | Mitani et al. | 439/946 |
| 5,973,925 A | * | 10/1999 | Kraemer | 439/946 |
| 6,174,205 B1 | * | 1/2001 | Madsen et al. | 439/946 |
| 6,217,351 B1 | * | 4/2001 | Fung et al. | 439/131 |

* cited by examiner

*Primary Examiner*—P. Austin Bradley
*Assistant Examiner*—Briggitte R. Hammond
(74) *Attorney, Agent, or Firm*—Daryl W. Schnurr (57) ABSTRACT

A PCMCIA card is provided with integrated connectors for standard telephone or LAN or other communication medium for use in corresponding slots of a laptop computer. The card has a first assembly and a second assembly that are movable relative to one another. The card can be operated in a fully contracted position or in a fully extended position or in a number of intermediate positions. In the extended position, the card can be connected to a telephone line or LAN using industry standard cables while occupying only one slot of the laptop leaving the other slot accessible to a second card. In the contracted position the card can be used in a laptop with two standard PCMCIA slots while being fully inside the PCMCIA card slot and connected to a telephone line and/or LAN using industry standard cables. The card has a sliding cover for connectors located at one end thereof.

16 Claims, 10 Drawing Sheets

EXTENDABLE AND RETRACTABLE TYPE 2 PC CARD AND METHOD OF OPERATION THEREOF

This application claims benefit of provisional application Ser. No. 60/171,632 filed Dec. 27, 1999.

BACKGROUND OF THE INVENTION

1. Field of the Invention

This invention relates to a PC (PCMCIA) Card for use with electronic equipment having PC card slots.

2. Description of the Prior Art

Figure 1A:
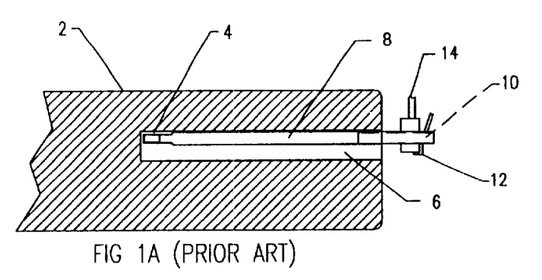
FIG. 1A is a partial sectional side view of a prior art 3Com 5 mm card located in a slot in with the telephone or LAN connector in an extended position.
Figure 1B:
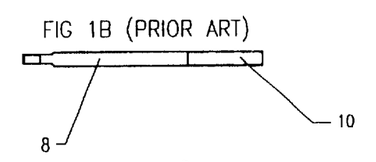
FIG. 1B is a side view of the card of FIG. 1A with the telephone or LAN connector in an unextended position.

Most laptop computers contain two slots for PCMCIA Cards. The slots are located immediately adjacent to one another and each slot has a height of approximately 5 mm. The two slots will accommodate two PCMCIA 5 mm cards or a single PCMCIA 10.5 mm card. The PCMCIA cards are used to provide various types of add-on features in a laptop. Connection between the PCMCIA card and external devices, telephone network or Local Area Network (LAN) usually requires special extension cables. In the case of PCMCIA cards, special extension cables used for connecting a laptop to the telephone lines for Internet access or to connect the laptop to a LAN are subject to damage due to frequent use. Since such cables are unique to a particular manufacturer of PCMCIA card, users do not have immediate access to replacement cables in the event of loss or damage to these cables and can find themselves unable to connect to the external world without the cable. On the other hand, if there was a way to use standard telephone or LAN cables, users can replace lost or damaged cables very quickly due to wide availability of such cables from a number of sources. There exists a 3Com PCMCIA 5 mm card with an XJACK feature that allows the card to be connected to a telephone line using a standard telephone cable with modular telephone plugs, thus eliminating the need for a special extension cable. The disadvantage of this card, as shown in FIG. 1A is that when the card is located in one of the slots the telephone plug inserted into the XJACK could block access to the second card slot in the laptop computer. As can be seen from the side view of the card in FIG. 1A, an end of the card where the telephone plug is connected is extendable. When a telephone plug is not desired to be used with the card, the telephone connector can be pushed back inside the card as shown in FIG. 1B and the top view in FIG. 1C. When this PCMCIA card is to be connected to the telephone line, the user pops out the telephone connector and plugs a standard telephone cable into the extended telephone connectors shown in FIG. 1A. This card cannot be connected to a telephone connector in the pushed in position.

There also exists a XIRCOM 10.5 mm PCMCIA card that may be plugged into the bottom slot of a laptop computer. This card has one or more standard telephone jacks and LAN jack built into the card. Standard telephone and LAN cables can be used to connect this card to the outside world or to the Internet. This card has a disadvantage, as shown in FIG. 1D, in that the card uses up both slots of the laptop computer. It follows that this type of card cannot be used in laptops that have only a single 5 mm PCMCIA card slot. The Xircom card can best be seen in the top view of FIG. 1E and the side view of FIG. 1F.

SUMMARY OF THE INVENTION

It is an object of the present invention to provide a PCMCIA card with built-in standard telephone jacks and LAN jacks that can be used in two or more user selectable separate configurations overcoming the limitations of the prior art while providing the ability for direct connection to the telephone line or a LAN using standard cables.

A PCMCIA card is used in PCMCIA card slot of a laptop computer and a telephone line or LAN with standard cables. The PCMCIA card comprises two assemblies. A first assembly comprises electronic circuitry and a second assembly comprises connectors for external connections. The two assemblies are electrically connected to one another and are movable relative to one another. The card has a filly contracted positions a fully extended position and one or more intermediate positions. The card increases in length as the assemblies are extended relative to one another. The card is capable of being directly connected to a telephone line or LAN using standard cables while occupying one slot and not preventing access to or from a second slot.

A method of using a PCMCIA card that can be connected to a telephone line or LAN using standard cables in a corresponding slot of a laptop computer having two slots. The card has an extended position and the method comprises moving the card to the extended position and inserting the card into an upper slot of the two slots leaving a lower slot of the two slots accessible and plugging standard telephone line cable and LAN cable into the corresponding jacks that are built into the connector assembly.

In the extended position the connector assembly may protrude out of the laptop body. Because the depth of the PC Card slot varies from laptop to laptop, the PCMCIA card can be expanded to various lengths and locked in that position. This enables the protruding portion of the connector assembly to be fully outside the PC Card slot and yet remain flush against the body of the laptop.

The card has a contracted position and the method comprises moving the card to the fully contracted position and inserting the card into the bottom slot of the two slots and plugging standard telephone line cable and LAN cable into the corresponding jacks that are built into the connector assembly.

In the fully contracted position, the PCMCIA card is exactly the same length as a standard PCMCIA card and as such fits completely inside the PC Card slot of the laptop computer. In the fully contracted position the upper PCMCIA slot cannot be used.

BRIEF DESCRIPTION OF THE DRAWINGS

FIG. 3A through FIG. 7 show various details of five different ways by which the two assemblies of the PCMCIA card of the present invention can be interconnected physically and electrically.

DESCRIPTION OF A PREFERRED EMBODIMENT

The PCMCIA card of the present invention has a maximum height of 10.5 mm but can be used in such a manner that it occupies only one 5 mm slot of a laptop computer while not preventing access to the other 5 mm slot if a second PCMCIA card slot exists in the laptop computer. The key feature of the present invention is the capability of extending the PCMCIA card of the present invention in one or more steps from a fully contracted position to a fully extended position while maintaining electrical contact between the two moving assemblies. Similarly, the PCMCIA card of the present invention can be contracted from a fully extended position in one or more steps to a fully contracted position while maintaining electrical contact between the two assemblies of the PCMCIA card of the present invention.

Figure 2A:
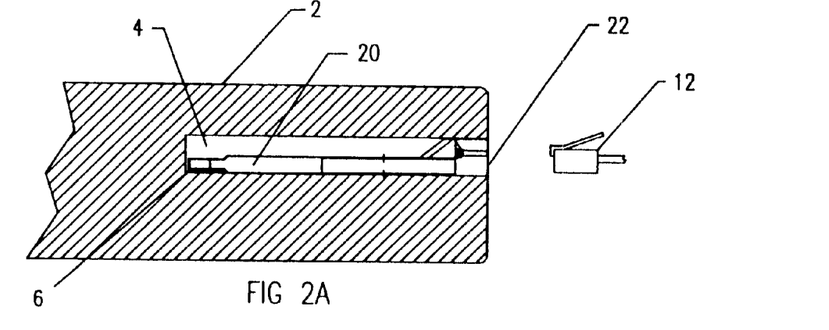
FIG. 2A is side view of a PCMCIA card of the present invention in a fully contracted position located in a lower slot.

If it is required that the PCMCIA card of the present invention use only a single PCMCIA card slot, the PCMCIA card would be extended to the appropriate length that would result in the connector assembly protruding outside the PCMCIA cavity yet remaining as flush against the body of the laptop computer as practicable and inserted into the top slot of the laptop computer. The bottom PCMCIA slot will not be blocked and may be used for another type of PCMCIA card. This situation is shown in FIG. 2C.

Alternatively, if it is desired that the PCMCIA card of the present invention is fully inside the PCMCIA cavity of the laptop computer, the PCMCIA card of the present invention will be fully contracted and inserted into the bottom PCMCIA slot of the laptop computer and uses both PCMCIA slots of the laptop computer. This situation is shown in FIG. 2A.

The connector assembly of the PCMCIA card of the present invention is 10.5 mm high and as such will fit inside a two PCMCIA card cavity. The maximum height of 10.5 mm enables various types of standard connectors such as telephone and LAN jacks to be built into the connector assembly of the PCMCIA card of the present invention so that standard cables such as modem cables and LAN cables can be directly plugged into the PCMCIA card of the present invention.

In FIG. 1A, a laptop computer 2 (only part of which is shown) has an upper slot 4 and a lower slot 6 located immediately adjacent to one another. A prior art card 8 is located in the upper slot 4. The card 8 has an extended connector end 10 for receiving a conventional modular plug 12 connected to a telephone line 14 (only part of which is shown)

Figure 1C:
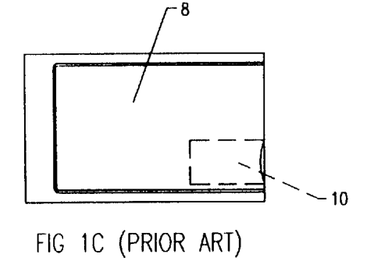
FIG. 1C is a top view of the card of FIG. 1A with the telephone or LAN connector in an unextended position
Figure 1D:
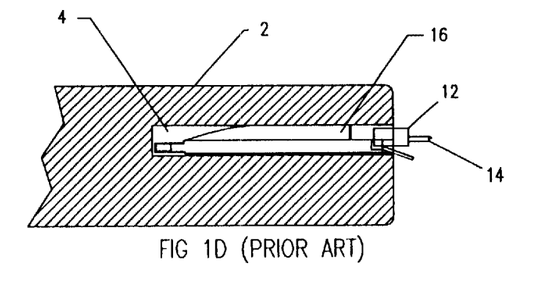
FIG. 1D is a partial sectional side view of a prior art XIRCOM 10.5 mm card located in a slot.

In FIGS. 1B and 1C, the card 8 is shown with the connector in a contracted Position. In the contracted position, the card cannot be connected to a standard telephone line plug 12 when the card has been inserted in the upper slot 4.

Figure 1E:
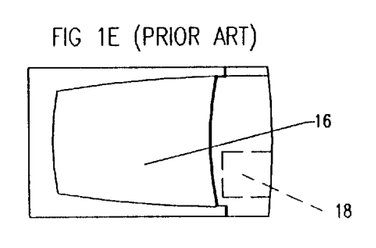
FIG. 1E is a top view of the card of FIG. 1D.
Figure 1F:
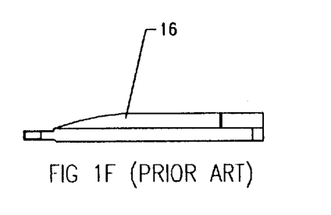
FIG. 1F is a side view of the card of FIG. 1D.

The same reference numerals are used in FIG. 1D to describe those components that are identical to those of FIG. 1A. FIG. 1D shows a 10.5 mm prior art PCMCIA card 16 occupying both the upper slot 4 and lower slot 6 of a laptop computer 2. A standard telephone plug 12 connected to a telephone line 14 is inserted into a connector end 18 of the card 16. The connector end is not movable relative to a remainder of the card and the card 16 must occupy both slots when it is inserted into the laptop 2. FIGS. 1E and 1F are top and side views respectively of the card 16 with the plug 12 not shown.

The same reference numerals are used in FIG. 2A to describe those components that are identical to those of FIG.

1A. In FIG. 2A, there is shown a PCMCIA card 20 in accordance with the present invention occupying both slots 4, 6 of the laptop 2. The card 20 is in an fully contracted or retracted position and the telephone plug 12 is poised to be located in a connector end 22 of the card 20. It can be seen that the telephone plug 12 will be located partially within the two slots 4, 6 when it is inserted into the connector end 22. With the plug 12 removed the outside edge of the card 20 does not extend outside the PCMCIA slots 4,6.

Figure 2B:
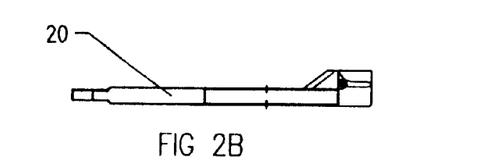
FIG. 2B is a side view of the card of FIG. 2A.
Figure 2C:
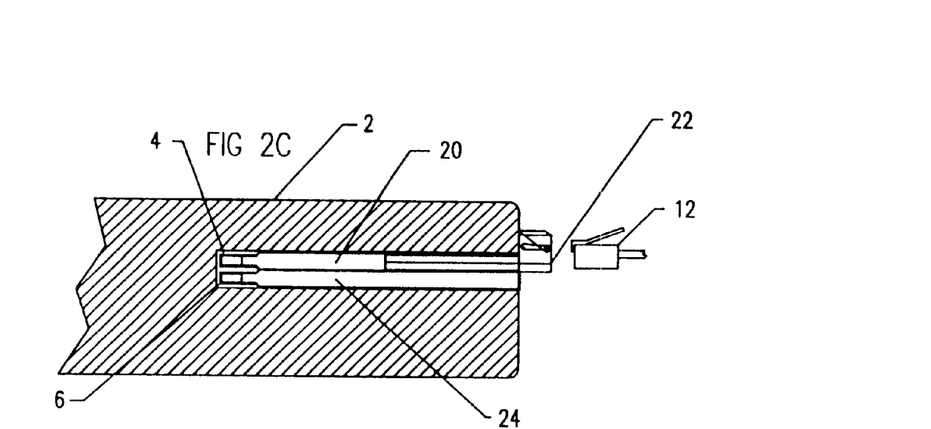
FIG. 2C is a side view of a PCMCIA card of the present invention in an extended position located in an upper slot and allowing use of a lower slot.

In FIG. 2B, the card 20 is shown in a contracted position with the telephone plug 12 not shown.

In FIG. 2C, those components that are identical to the components of FIG. 2A are described using the same reference numerals. It can be seen that the upper slot 4 contains the card 20 that is in an extended position with the connector end 22 extending outside of the slot 4. The telephone plug 12 is located within the connector end 22. In addition, a conventional second PCMCIA 5 mm card 24 occupies a lower slot 6.

Figure 2D:
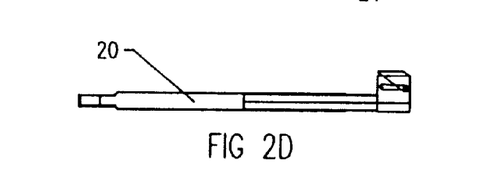
FIG. 2D is a side view of the card of the present invention in an extended position.

In FIG. 2D, there is shown a side view of the card 20 in the extended position with the plug 12 not shown.

Figure 3A:
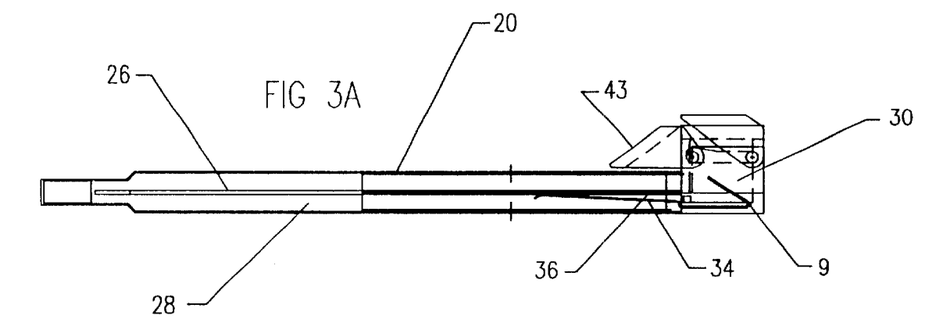
FIG. 3A is an enlarged side view of the card of the present invention in a fully contracted position, said card having sliding contacts electrically connecting two assemblies.
Figure 3B:
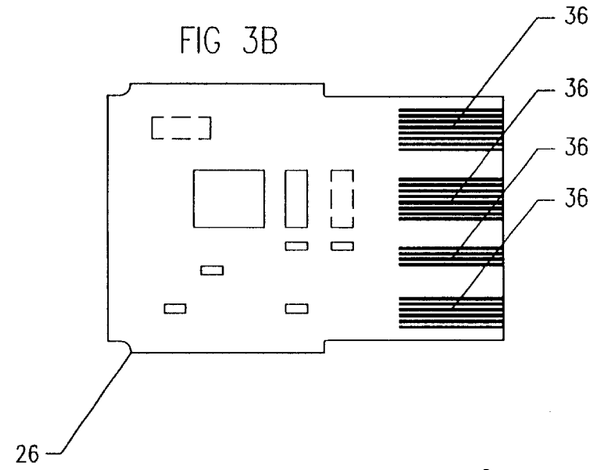
FIG. 3B is a bottom view of the printed circuit board (PCB) that has the electronics on top and bottom and printed circuit tracks on the bottom side that slide over the contacts attached to the connector assembly. This printed circuit board is inside the first assembly of the card of FIG. 3A.
Figure 3C:
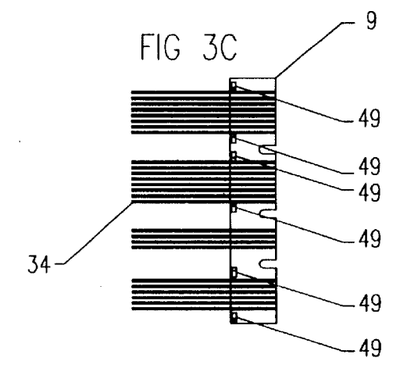
FIG. 3C is a bottom view of the printed circuit board to which the electrical contacts are soldered. This printed circuit board is inside the second assembly of the card of FIG. 3A.

In FIG. 3A, there is shown a schematic side view of a PCMCIA card 20 in accordance with the present invention. The card has a first assembly 28 and a second assembly 30. The first assembly 28 contains electronic circuitry on a printed circuit board 26, which can have various configurations and is conventional. The electronic Circuitry is not described in detail in the present application as it is conventional and there is a wide variation of circuitry that can be used in the first assembly. The second assembly 30 contains a PCB (printed circuit board) 9 with LED's 49, sliding contacts 34, the connector end 22 with fiber optic rods 60. Since the first assembly 28 and the second assembly 30 are movable relative to one another and must be electrically connected at all times, the sliding contacts 34 slides along on tracks 36 on the bottom side of PCB 26 and remains in contact with the tracks 36 from the fully contracted position to the fully extended position, thereby maintaining the electrical connection between the two assemblies 28, 30. In FIG. 3B, it can be seen that the printed circuit board 26 has gold plated tracks 36 on the bottom of the PCB 26 of the first assembly 28. In FIG. 3C, LED's 49 and contacts 34 are soldered to printed circuit board 9 of the second assembly that is aligned with and interconnected with the printed circuit on the first assembly 28. In FIG. 3A, it can be seen that the second assembly 30 has a cover 43 affixed thereto.

Figure 3D:
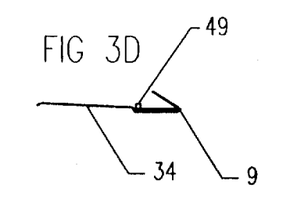
FIG. 3D is a side view of the printed circuit board of FIG. 3C which is inside the second assembly of the card of FIG. 3A.

In FIG. 3D, there is shown a side view of the printed circuit board 9 with sliding contact 34 soldered to it, which is used in FIG. 3A to maintain electrical contact between the two assemblies when the assemblies are moved relative to one another.

Figure 4A:
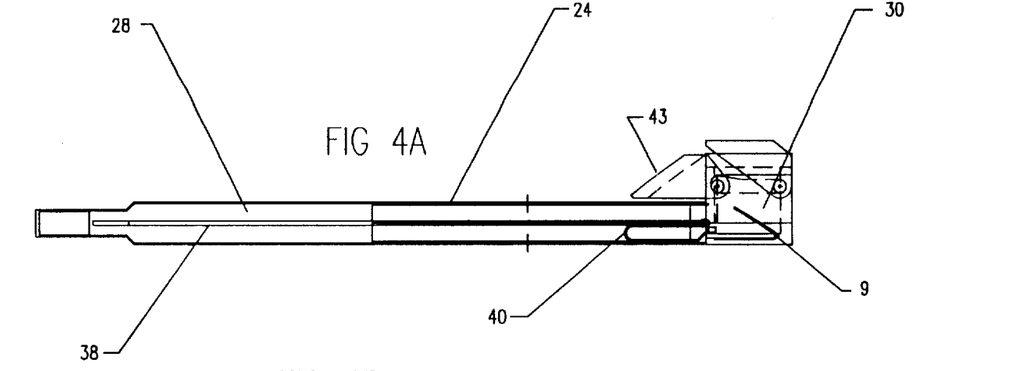
FIG. 4A is a side view of a further variation of the card of the present invention having a folded flat cable electrically connecting two assemblies.

In FIG. 4A, there is shown a PCMCIA card 24 that is similar to the version of the PCMCIA card 20 shown in FIG. 3A except for the manner in which the two assemblies 28, 30 are interconnected. Those components of FIGS. 4A, 4B and 4C that are identical to the components in FIGS. 3A, 3B and 3C are described using the same reference numerals and are not further described except where necessary. A folded flat cable 40 soldered to the PCB 38 in assembly 28 and to the PCB 9 in assembly 30 maintains the electrical connection between the second assembly 30 and the first assembly 28 from the fully contracted position to the fully extended position.

Figure 4B:
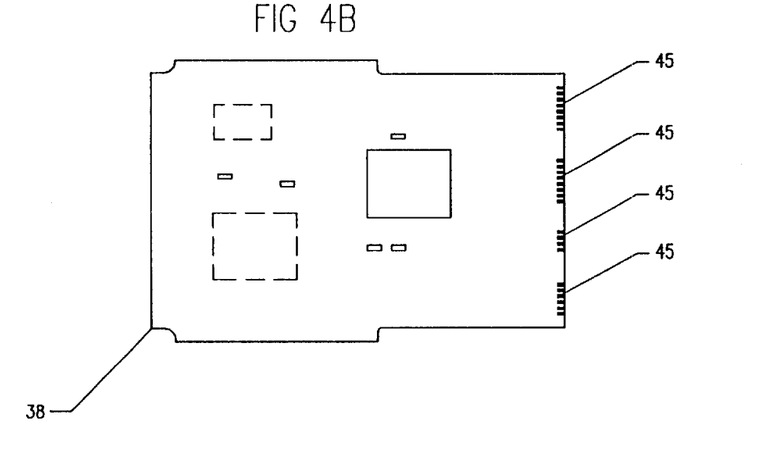
FIG. 4B is a bottom view of the printed circuit board that has electronic components on top and bottom and solder pads at the printed circuit board edge to which one end of the folded flat cable is soldered. This printed circuit board is inside the first assembly of the card of FIG. 4A.
Figure 4C:
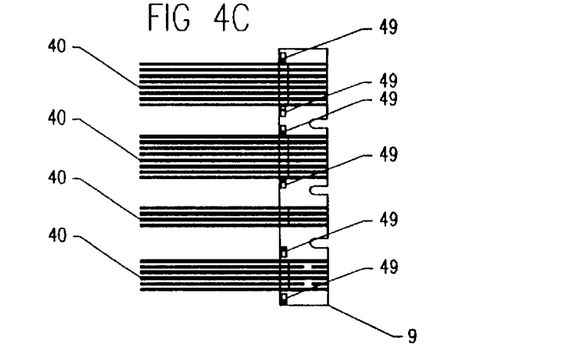
FIG. 4C is a bottom view of the printed circuit board to which the other end of the folded flat cable is soldered. Also soldered to this printed circuit board are the contacts that provide electrical contact for the external cables. This printed circuit board is inside the second assembly of the card of FIG. 4A.

In FIG. 4B, it can be seen that the printed circuit board 38 of the first assembly 28 has components on top and bottom side and solder pads 45 on the bottom side to which one end of the flat cable is soldered. In FIG. 4C, the printed circuit board 9 of the second assembly 30 has the other end of the flat cable soldered to it. LED's 49 are also soldered to the PCB 9 and are controlled by the electronic circuitry on PCB 38. The cover 43 is shown in FIG. 4A. LED's 49 indicate various operational states of the PCMCIA card of the present invention.

Figure 4D:
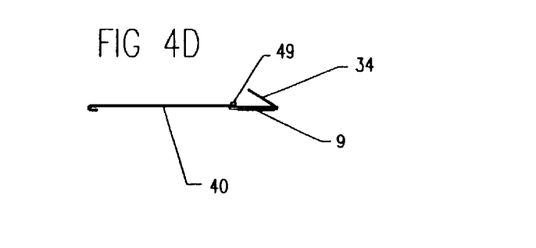
FIG. 4D is a side view of the printed circuit board of FIG. 4C which is inside the second assembly of the card of FIG. 4A.

In FIG. 4D, there is shown a side view of the flat cable 40, which is used in FIG. 4A to maintain electrical contact between the two assemblies when they move relative to one another.

Figure 5:
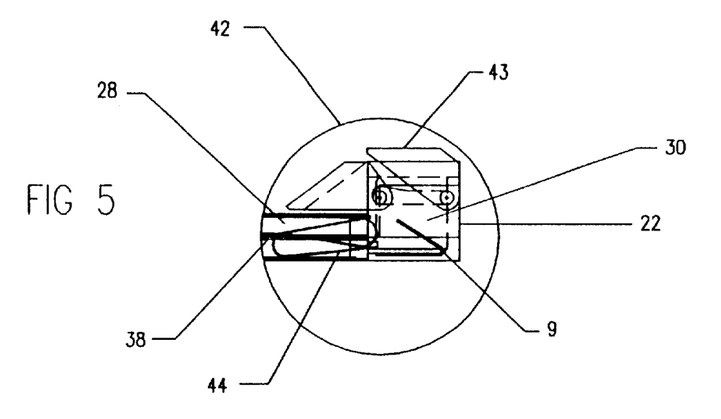
FIG. 5 is a partial side view of a further embodiment of a card of the present invention having a double folded flat cable electrically connecting the two assemblies.

In FIG. 5, those components that are identical to the components of FIG. 4A are assigned the same reference numeral and are not further described except where necessary. There is shown a partial side view of a PCMCIA card 42 that is similar to the card 24 shown in FIG. 4A except that the electrical connection between the two assemblies 28 and 30 is maintained by a double folded flat cable 44.

Figure 6:
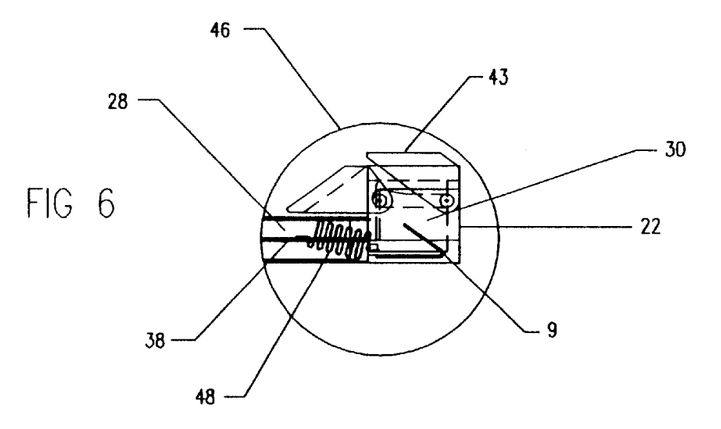
FIG 6 is a partial side view of still a further embodiment of the card of the present invention having an accordion shaped flat cable providing an electrical connection between the two assemblies.

In FIG. 6, the same reference numerals are used to describe those components of FIG. 6 that are identical to the components of FIG. 4A. The components are not further described except where necessary. There is shown another partial side view of a PCMCIA card 46 having a flat cable 48 formed in an accordion shape and soldered to PCB 38 and PCB 9 to maintain the electrical position between the two assemblies 28, 30 from the fully contracted position to the fully extended position.

Figure 7:
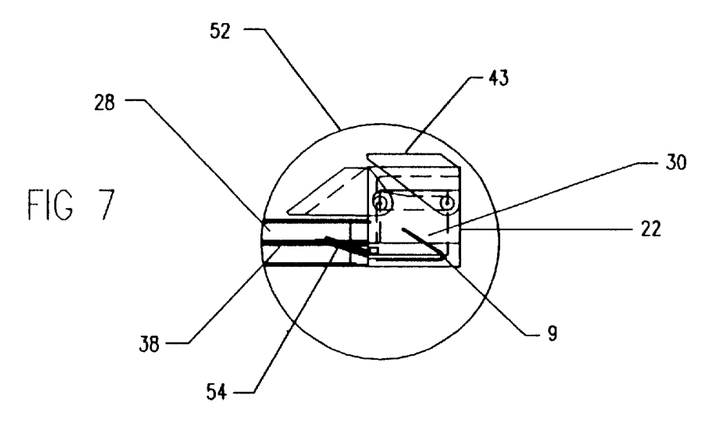
FIG. 7 is a partial side view of yet another embodiment of the present invention where an electrical connection is provided by a spring contact between the two assemblies

In FIG. 7, the same reference numerals are used to describe those components that are identical to the components of FIG. 4A and the components are not further described except where necessary. There is shown yet another partial side view of a PCMCIA card 52 having spring contacts 54 extending between PCB 38 of the first assembly 28 and PCB 9 of the second assembly 30 to maintain the electrical connection from the fully contracted position to the fully extended position.

Figure 8A:
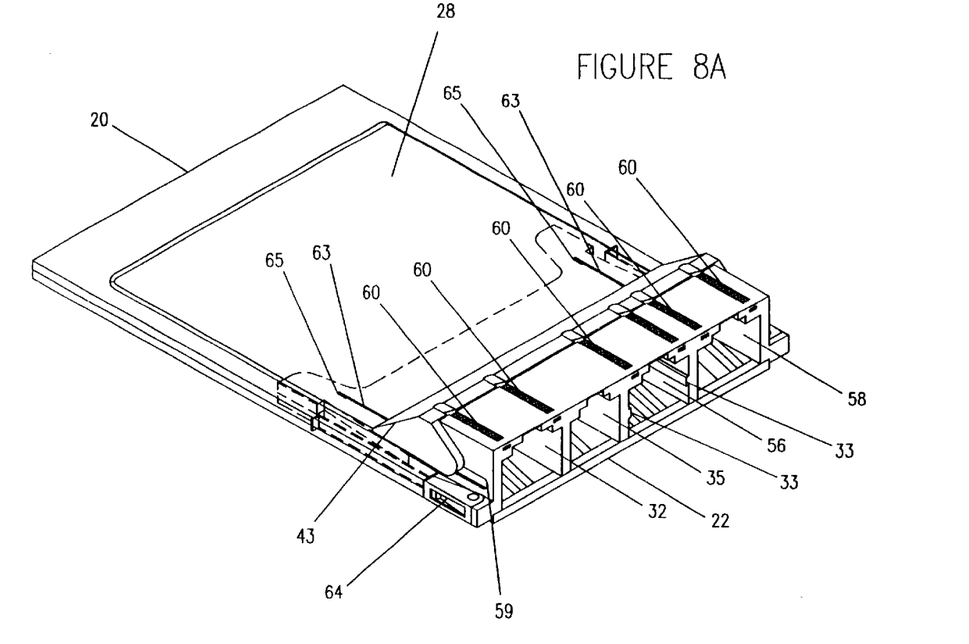
FIG. 8A is a perspective view of a PCMCIA card in a fully contracted position.

In FIG. 8A, there is shown a perspective view of the card 20 from an end of the connector housing 22 showing connectors 32, 35, 56, 58, in one arrangement of connectors. The same reference numerals are used in FIGS. 8A and 8B as those used in FIGS. 2A, 2B, 2C, 2D, 3A, 3B, 3C and 3D to describe those components that are identical. The connector housing 22 is not limited to standard modular connections such as the popular RJ9, RJ11/12 and RJ45 and can accommodate a variety of other standard connectors as well as custom connectors in any mix. It can be seen that the connector 56 has keys 33 extending along both sides. This connector is the options connector and the keys 33 are preferred, but not required. The keys are located to prevent a conventional telephone plug from being inserted into the connector by mistake. The card 20 in FIG. 8A is in a contracted position. It can be seen that the cover 43 is in an open position so that the maximum height of the PCMCIA card does not exceed 10.5 mm in the fully contracted position. The connector 32 is a standard RJ11 telephone jack. The connector 35 is a standard RJ9 digital phone jack. The connector 58 is a standard RJ45 jack and an option jack 56 is used for other optional connections. The cover is in the same open position as that shown for FIG. 2A where the card is inserted into the slot in a contracted position.

Figure 8B:
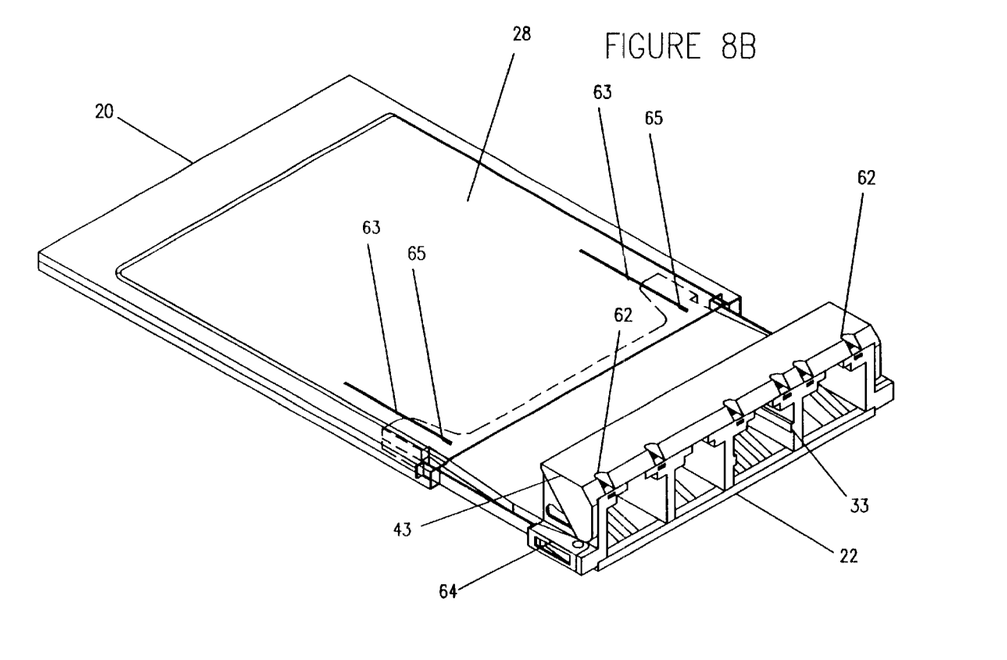
FIG. 8B is a perspective view of a card of FIG. 8A in an fully extended position.

In FIG. 8B, the card 20 is shown in an extended position and the cover 43 is in a closed position providing a dust cover for the connectors. The same reference numerals are used in FIG. 8B to describe those components that are identical to the components shown in FIG. 8A. Light pipes 60 are located along each connector and notches 62 allow the light pipe to be seen when the cover is in a closed position. Along each side of the card 20, a locking clip 64 is located.

Figure 9A:
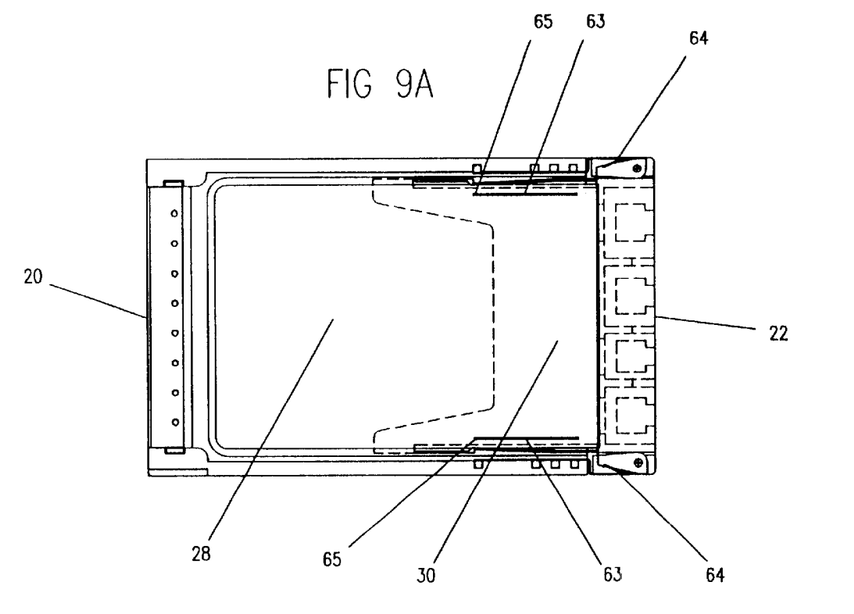
FIG. 9A is a top view of a card of the present invention in a fully contracted position.
Figure 9B:
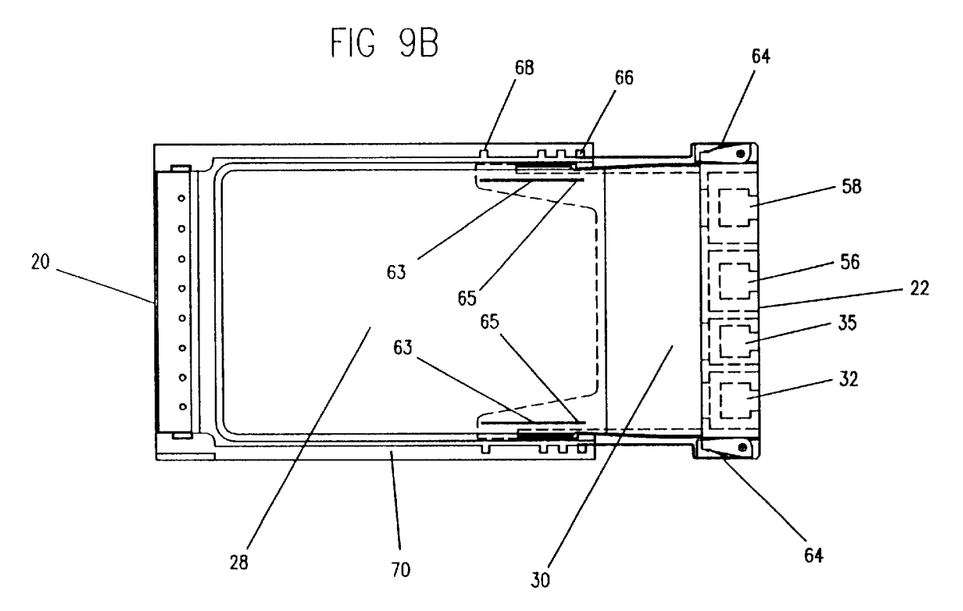
FIG. 9B is a top view of a card of the present invention in a fully extended position.

In FIG. 9A, there is shown a top view of the PCMCIA card 20 in the contracted position and in FIG. 9B there is shown a top view of the card 20 in the extended position. In FIGS. 9A and 9B, the same reference numerals are used to describe those components that are identical to the components of FIGS. 3,4,5,6,7 and 8 The card 20 shown in FIGS. 9A and 9B does not have a cover.

It can be seen from FIGS. 9A and 9B that the card 20 has the first assembly 28 and the second assembly 30. The first assembly 28 is the fixed assembly and the second assembly 30 is the retractable assembly that contains the connector end 22. It can be seen that there are two locking clips 64 mounted on the second assembly 30 of the card PCMCIA card 20. The locking clips 64 each have a free end 66 that is shaped to fit within a series of corresponding indentations 68 along either side 70 of the first assembly 28. The indentations 68 provide various positions from the fully contracted position to the fully extended position of the second assembly relative to the first assembly. Since the actual length of the PCMCIA slots 4,6 varies from laptop to laptop, the purpose of the indentations is to provide adjustable extension such that connector housing 22 will be flush against the body of the laptop when the card is inserted into the card slot. If it is desired to move the two assemblies relative to one another, a user will manually compress the two free ends 66 of the two locking clips 64 toward one another. That will disengage the free ends from the corresponding indentations. The second assembly will then slide relative to the first assembly. When a desired position is about to be reached, the free ends can be manually released and as soon as the free ends 66 become aligned with corresponding indentations, the spring action of the locking pins will cause the free ends 66 to become inserted into those indentations and temporarily lock the two assemblies in that position relative to one another. It can be seen from FIGS. 9A and 9B that there are four indentations along each side of the assembly 28. The two assemblies have four positions relative to one another, a fully contracted position, a fully extended position and two intermediate positions. Additional indentations 70 can be added to provide more or finer intermediate positions.

Figure 10A:
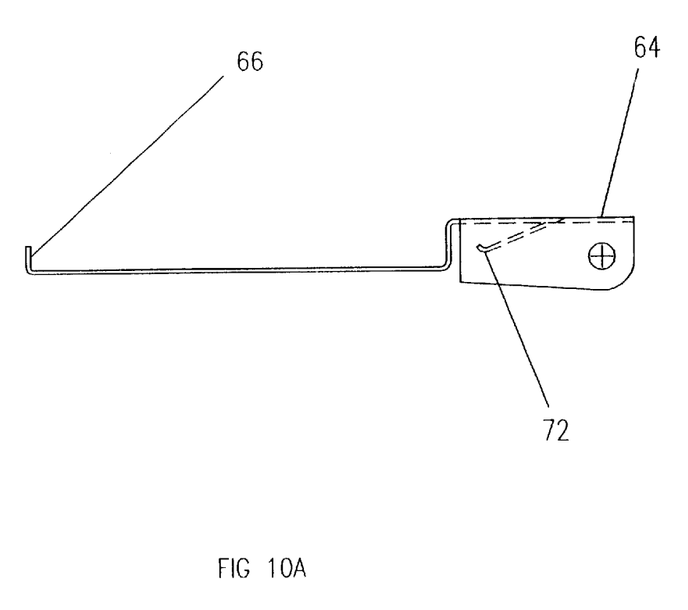
FIG. 10A is a side view of a locking clip.
Figure 10B:
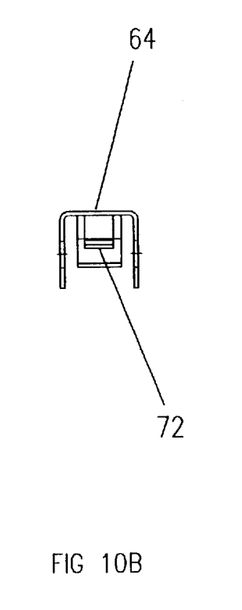
FIG. 10B is an end view of a locking clip.

In FIG. 10A, there is shown a side view of a locking clip) 64 for releasing and locking the assemblies 28, 30 (not shown in FIG. 10A) in various positions relative to one another. A formed spring 72 maintains the clip 56 on the assembly 30. FIG. 10B shows an end view of the clip 56 and spring 58. There is one clip 56 on either side of the assembly 30 as best seen in FIGS. 9A and 9B.

While the preferred embodiment uses a locking clip for the extension and contraction of the PCMCIA card to achieve various lengths, other techniques could be employed to achieve the same function of the present invention.

Figures 11A, 11B:
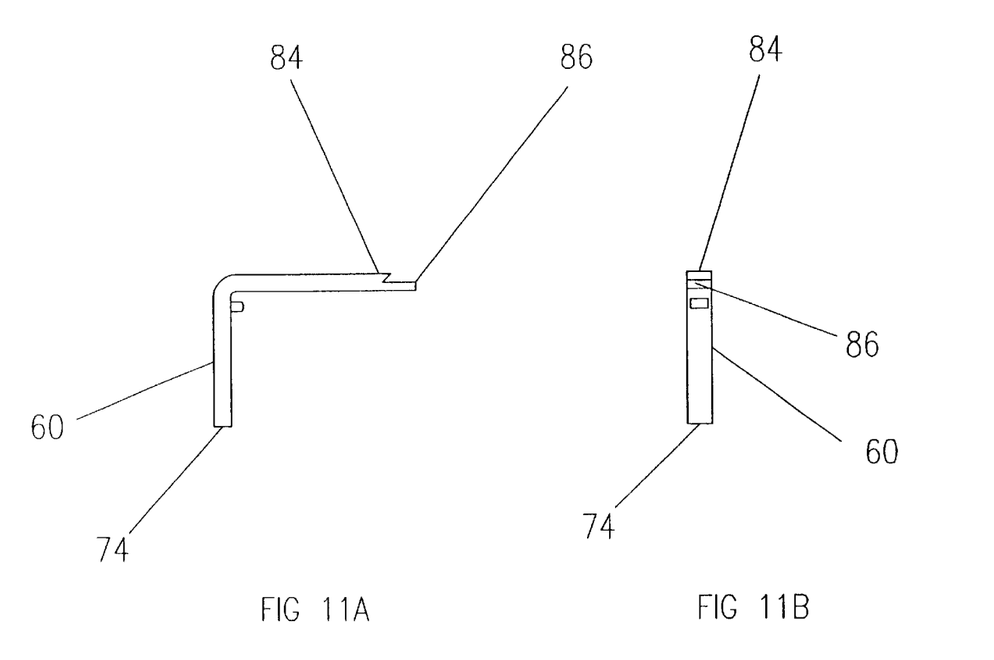
FIG. 11A is a side view of a light pipe that is used on the second assembly of the card of the present invention.
FIG. 11B is an end view of the light pipe of FIG. 11A.

In FIGS. 11A and 11B, light pipe 60 is L-shaped and connected to a light source (not shown) at point 74. Light output occurs at a reduction 84 and an upper end 86. The angled notch at the front of the fiber optic rod enables the light to be emitted both from the front and the top thereby enabling the LED status to be viewed from the front as well as from the top of the fiber optic rod. The light pipe 60 is a fiber optic rod and the light emitted from the light pipe reflects the intensity and on/off status of the LED (not shown in FIGS. 11A and 11B) over which the fiber optic rod is mounted.

Figure 12A:
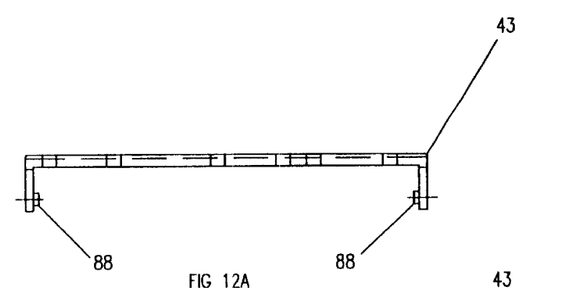
FIG. 12A is an end view of a cover that attaches to the second assembly of the card of the Present invention.
Figure 12B:
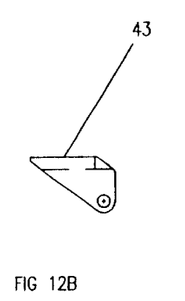
FIG. 12B is a side view of the cover of FIG. 12A.
Figure 12C:
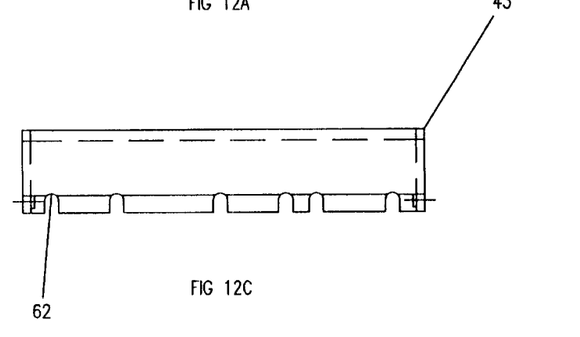
FIG. 12C is a top view of the cover of FIG. 12A.

In FIGS. 12A, 12B and 12C, it can be seen that the cover 43 has projections 88 that are sized to slide in a slot 59 (see FIGS. 8A and 8B) of the card 20 so that the cover can move from an open position to a closed position and vice versa. The cover has notches 62 as previously described.

We claim:

1. A PCMCIA card for use in a PCMCIA card slot of a laptop computer and a telephone line or LAN with standard cables, said card slot comprising two slots, said card having two assemblies, a first assembly comprising electronic circuitry and a second assembly comprising connectors for receiving line connections, said two assemblies being electrically interconnected to one another and being movable relative to one another, said card having a contracted position and an extended position, said card increasing in length as said assemblies are extended relative to one another, said card being capable of being directly connected to a telephone line or LAN using standard cables while occupying one slot and not preventing access to or from a second slot.

2. A PCMCIA card as claimed in claim 1 wherein said card occupies only one slot when said card is in said extended position and occupies two slots when said card is in said contracted position.

3. A PCMCIA card as claimed in claim 2 wherein said laptop has an upper card slot and a lower card slot, said card being located in said upper card slot in an extended position, thereby not preventing access to said lower slot.

4. A PCMCIA card as claimed in claim 2 wherein there are sliding contacts connected between said first assembly and said second assembly to maintain electrical contact between said two assemblies when said card is moved between an extended position and a contracted position.

5. A PCMCIA card as claimed in claim 2 wherein there are spring contacts extending between said first assembly and said second assembly to maintain an electrical connection between said assembly when said card is moved between a contracted position and an extended position.

6. A PCMCIA card as claimed in claim 2 wherein at least one of said connectors contains keys, said keys being located to allow insertion only of a specific plug or plugs.

7. A PCMCIA card as claimed in claim 2 wherein said card has four positions, an extended position, a contracted position and two intermediate positions, two locking pins, one pin extending along each side of said card, said pins being spring-mounted and releasably locking said assemblies in each position.

8. A PCMCIA card as claimed in claim 2 wherein said card has a dust cover that slides back when the said PCMCIA card is to be used as a 10.5 mm PCMCIA card, the said dust cover also protecting the connector housing from dust and other elements when the said PCMCIA card is in a extended position and protrudes outside the PCMCIA card slot.

9. A PCMCIA card as claimed in claim 2 wherein said card has one or more fiber optic light pipes inserted into the connector assembly to enable viewing a status of an LED either directly from a front or from above.

10. A PCMCIA card as claimed in claim 2 wherein said two assemblies are electrically connected by a folded flat cable to maintain an electrical connection from said first assembly to said second assembly when said card is moved between a contracted position and an extended position.

11. A PCMCIA card as claimed in claim 10 wherein the flat cable is a double folded cable.

12. A PCMCIA card as claimed in claim 10 wherein said flat cable is in an accordion shape.

13. A PCMCIA card as claimed in claim 2 wherein there are locking clips extending between said first assembly and said second assembly on either side of said card, said locking clips allowing said assemblies to be moved between a contracted position and an extended position, said locking clips temporarily locking said assemblies in each position.

14. A PCMCIA card as claimed in claim 13 wherein said locking clips each contain a spring, said spring being biased to force said clips outward.

15. A method of using a PCMCIA card that can be connected to a telephone line or LAN or another communication medium using standard cables, in a corresponding slot of a laptop computer, said laptop having two slots, said card having an extended position, said method comprising moving said card to said extended position and inserting said card into an upper slot of said two slots in a manner that leaves a lower slot of said two slots accessible, connecting said card to said telephone line or LAN or other communication medium using industry standard cables in a manner that leaves said lower slot of said two slots accessible.

16. A method of using a PCMCIA card that can be connected to a telephone line, a LAN or another communication medium using industry standard cables, in a corresponding slot of a laptop computer, said laptop having two slots, said card having a fully contracted position corresponding to the standard length of a PCMCIA card and an extended position, said method comprising moving said card to the fully contracted position and inserting the said card into the lower slot of the said two slots, connecting said card to said telephone line or LAN or other communication medium using industry standard cables.

* * * * *